United States Patent [19]

Horna

[11] 4,021,740
[45] May 3, 1977

[54] SINEWAVE CLOCK DRIVER WITH ADJUSTABLE DELAY

[75] Inventor: Otakar Anthony Horna, Bethesda, Md.

[73] Assignee: Communications Satellite Corporation (Comsat), Washington, D.C.

[22] Filed: Jan. 30, 1976

[21] Appl. No.: 653,868

[52] U.S. Cl. .................................. 328/29; 307/261; 307/262; 307/270; 328/31; 328/62; 328/63
[51] Int. Cl.[2] ........................................ H03K 5/08
[58] Field of Search .......... 307/261, 262, 269, 270, 307/320; 328/28, 29, 31, 62, 63, 57; 331/45, 61

[56] References Cited

UNITED STATES PATENTS

| | | | |
|---|---|---|---|
| 2,226,459 | 12/1940 | Bingley | 328/29 |
| 3,196,368 | 7/1965 | Potter | 307/320 |
| 3,213,291 | 10/1965 | Reid | 307/261 |
| 3,268,818 | 8/1966 | Cole et al. | 307/261 |

OTHER PUBLICATIONS

"Wave Squarer Shifts Phase as Much as 360°" by Jung in Electronics, Aug. 3, 1970, p. 75.

Primary Examiner—Stanley D. Miller, Jr.
Attorney, Agent, or Firm—Sughrue, Rothwell, Mion, Zinn & Macpeak

[57] ABSTRACT

A sinewave clock distribution network and a clock driver for use in the network permit simplified distribution and synchronization in very high speed logic and digital transmission systems. The sinewave central clock is connected through a branching network to a plurality of clock drivers located in the vicinity of digital circuits to which clock pulses are to be supplied. Each clock driver includes a receiver amplifier which is AC coupled to the clock line. The output of the receiver amplifier is connected to a phase shift RC network which includes an adjustable capacitance. By adjusting the capacitance in the RC network, the timing or delay of the clock signal can be varied to permit synchronization of the clock signals at various points in the distribution network. The phase delayed signal from the RC network is coupled to a limiter which limits the input sinewave to form a squarewave for use by the digital circuits.

8 Claims, 6 Drawing Figures

SINEWAVE CLOCK DRIVER WITH ADJUSTABLE DELAY

BACKGROUND OF THE INVENTION

The present invention generally relates to the generation and distribution of clock signals to digital circuits, and more particularly to a sinewave clock distribution system having particular advantages in very high speed circuits.

Logic networks and digital transmission systems are designed to operate synchronously under control of a central clock. The clock signals are usually distributed in the digital network as pulses generated by a central pulse generator. A controlled impedance line matched at both ends must be used to prevent reflections which result in distortion of the clock pulse wave form. In any passive network, it is not possible to branch the controlled impedance line without impedance mismatch and/or without the use of a power dissipating impedance matching network. Instead of passive networks, it is known to use multiple output amplifiers for branching in the pulse distribution network; however, these amplifiers introduce additional delay in the clock pulse signal and, in addition, exhibit a temperature dependence in operation.

With the increased speed of digital logic circuits, the delay in the signal in interconnections and/or the precision of the timing of the clock ultimately determines the maximum bit rate of the whole system. Specifically, in very high speed circuits, the delays in the interconnecting signal lines are the same in magnitude as the delays in the logic circuits themselves. Therefore, at every individual point of the network, the clock timing must be adjusted to compensate for the line delays. Tapped lumped parameter delay lines are usually used for this purpose, but their disadvantages are cost, bulk, finite rise time, and delay adjustments only in discrete steps.

SUMMARY OF THE INVENTION

According to the present invention, timing signals are distributed as a sinewave signal which, at different points in the distribution system, is amplified, limited to a squarewave of appropriate parameters and then used to drive the clock inputs of digital circuits. More specifically, a sinewave central clock generator is connected through a branching network to a plurality of clock drivers each of which is located in the vicinity of the digital circuits to which clock pulse inputs are to be supplied. Each of the clock drivers includes a receiver amplifier which is AC coupled to the branching network. The output of the receiver amplifier is connected to a phase shift RC network which includes an adjustable capacitance. By varying the capacitance, the phase shift delay may be changed to permit synchronization of clock pulses in various parts of the digital network. The phase shift delayed signal is coupled to a limiter which limits the sinewave to form a squarewave to be applied to the clock inputs of the digital circuits.

There are several advantages to this arrangement. Although low impedance distribution transmission lines are used, the output power of the central clock is relatively small since low voltage amplitude sinewave clock signals are generated. Both the small amplitude of the sinewave clock signals and the low transmission line impedance reduces the possibility of crosstalk. In addition, since the capacitive and inductive crosstalk signals are proportional to dv/dt and di/dt, crosstalk is less than with a rectangular pulse signal of the same frequency since both of these quantities are lower for a sinewave signal. The amplification of the receiver amplifier can be set so that the clock driver's output is independent of a wide range of input sinewave clock signal amplitudes. In addition, the quality of the transmission line has little influence on the clock network because a sinewave signal is not distorted by variations in line parameters as a function of frequency. The AC coupling to the input of the receiver amplifier makes the clock driver insensitive to level shifts of the clock signal in the branching network. Also, by using a sinewave clock signal, the distribution system is insensitive to reflection and an all-pass network with variable phase angle to permit infinite adjustment of the clock signal timing may be used.

BRIEF DESCRIPTION OF THE DRAWINGS

The specific nature of the invention, as well as other objects, aspects, uses, and advantages thereof, will clearly appear from the following description and from the accompanying drawings, in which.

DESCRIPTION OF THE PREFERRED EMBODIMENT

If the propagation time is commensurable with the signal rise time in a clock pulse distribution network, then the reflections in a transmission line network can completely distort the transmitted pulse and cause false signals. The amplitude of the reflection must therefore be kept well below the so-called "noise margin" of a particular digital circuit. For emitter coupled logic (ECL) circuits, for example, the noise margin is typically 15%, and the reflection coefficients K in the distribution network have to be under 10%, i.e., $|K|<0.1$. If $Z_o$ is the characteristic impedance of the line and Z is the load and source impedance, then the permissible impedance mismatch is given by the following equation:

$$\frac{Z}{Z_o} = \frac{1+K}{1-K}$$

For $|K|<0.1$, the permissible impedance mismatch is $0.85<Z/Z_o<1.22$. This is very difficult or impossible to achieve in a complicated branched network of the type illustrated in FIG. 1.

Figure 1:
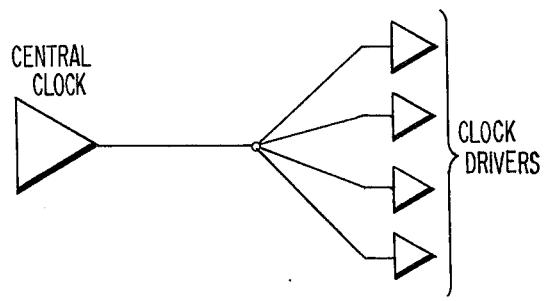
FIG. 1 is a simplified drawing illustrating one example of a sinewave clock distribution branching network.

According to the present invention, the central clock in the clock signal distribution system shown in FIG. 1 is a sinewave generator. With a sinewave, the reflections do not distort the waveform but only create a standing wave pattern in the transmission line network. If the receiver amplifier in a particular clock driver can handle signals with the amplitude ratio 1:4, the standing wave ratio of the same magnitude does not influence the signal distribution in the network. Therefore, an impedance mismatch of $0.25 < Z/Z_o < 4$ can be tolerated.

Figure 2:
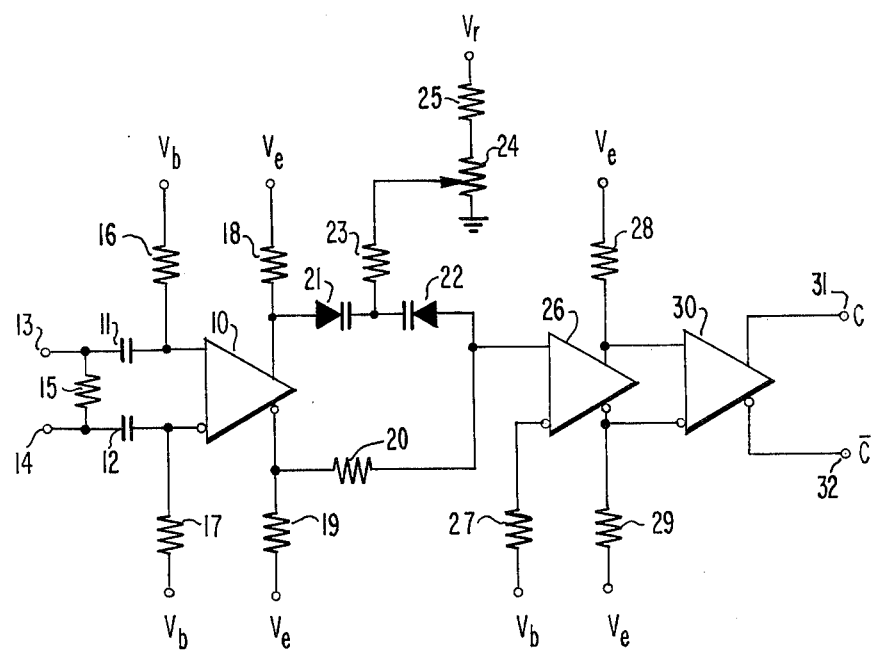
FIG. 2 is a schematic and block diagram of a specific embodiment of a clock driver with adjustable delay according to the invention.

Another advantage of the sinewave clock signal is that the timing of the signal, i.e., the phase delay at a certain point in the system, can be adjusted by changing the phase of the sinewave in an all-pass phase shift network. This is implemented in the clock driver illustrated more particularly in FIG. 2. Referring specifically to FIG. 2, the clock driver includes a receiver amplifier 10 having a balanced input which is capacitively coupled by means of capacitors 11 and 12 to a transmission line (not shown) connected to the input terminals 13 and 14, respectively. A matching impedance 15 is connected across the input terminals 13 and 14. A threshold voltage source $V_b$ is connected by means of resistors 16 and 17 to the balanced inputs of the receiver amplifier 10. The threshold voltage source permits the receiver amplifier to distinguish signals in a standing wave on the transmission line.

The balanced output of the receiver amplifier 10 is connected through load resistors 18 and 19 to a voltage source $V_e$ and also to a phase shift network comprising resistor 20 and variable capacitance diodes 21 and 22. The resistor 20 is connected in parallel with the variable capacitance diodes 21 and 22, and the anodes of the diodes 21 and 22 are connected in common. A resistor 23 is connected between the common junction of the anodes of the variable capacitance diodes 21 and 22 and the wiper arm of a potentiometer 24. The winding of potentiometer 24 is in turn connected to ground at one end and through a resistor 25 at the other end to a reference voltage source $V_r$. The capacitance of the diodes 21 and 22 can be changed by adjusting potentiometer 24 in a range of at least 1:10.

While a mechanical trimmer capacitor could be used instead of variable capacitance diodes 21 and 22 and the associated biasing network comprising potentiometer 24 and resistors 23 and 25, there are several advantages to using the variable capacitance diodes. Specifically, by using variable capacitance diodes instead of a mechanical trimmer capacitor, the entire clock driver circuit can be integrated on a single monolithic silicon chip. By using two variable capacitance diodes connected back-to-back, the influence of the amplitude of the sinewave clock signal on the effective capacitance of the combination of the two diodes is minimized. Moreover, the DC bias voltage can be easily made temperature dependent to compensate for all variations of delay with the temperature. Resistor 25 may be a temperature dependent resistor or, alternatively, a semiconductor temperature compensation network can be incorporated in the reference voltage source $V_r$. Since the capacitance of the phase shift network is electrically variable, a feedback or feedforward regulation system can be used instead of the reference voltage source $V_r$ in order to change the clock delay automatically according to the needs of the clock distribution network. Thus, an automatic "tuning up" of a sophisticated digital system can be realized where normal, manual adjustment is usually a lengthy process requiring highly skilled and trained personnel.

The output of the RC phase shift network taken from the junction of resistor 20 with the cathode of diode 22 is connected to the positive input of a first limiter amplifier 26. The negative input of limiter amplifier 26 is connected through a resistor 27 to the threshold voltage source $V_b$. This establishes a threshold level for the limiter amplifier 26. The balanced outputs of the amplifier 26 are connected through load resistors 28 and 29 to a supply voltage $V_e$ and also to the balanced inputs of a second limiter amplifier 30. Finally, the balanced outputs of limiter amplifier 30 are connected to output terminals 31 and 32 to provide a squarewave clock pulse signal C and an inverted squarewave clock pulse signal $\overline{C}$.

Figure 3A:
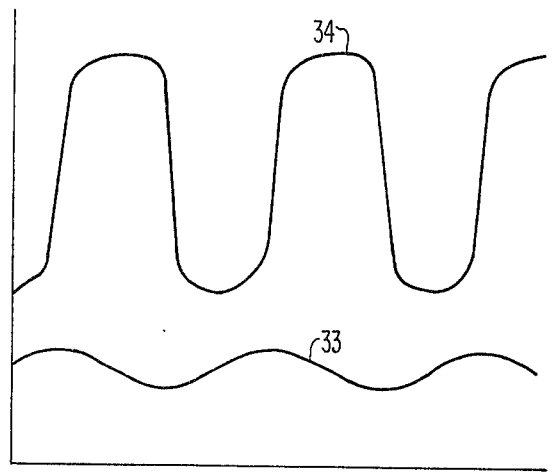
FIGS. 3A and 3B are graphical representations of the output waveforms of the clock driver shown in FIG. 2 for two different amplitudes of input sinewaves.
Figure 3B:
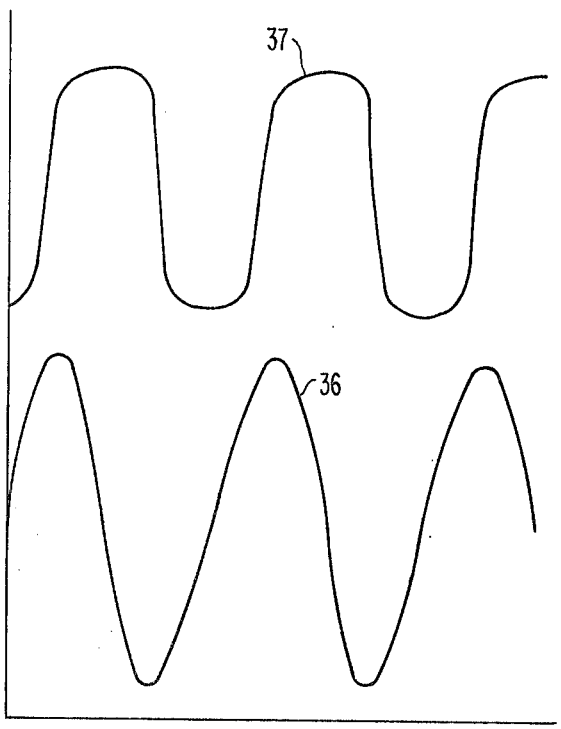
Figure 4A:
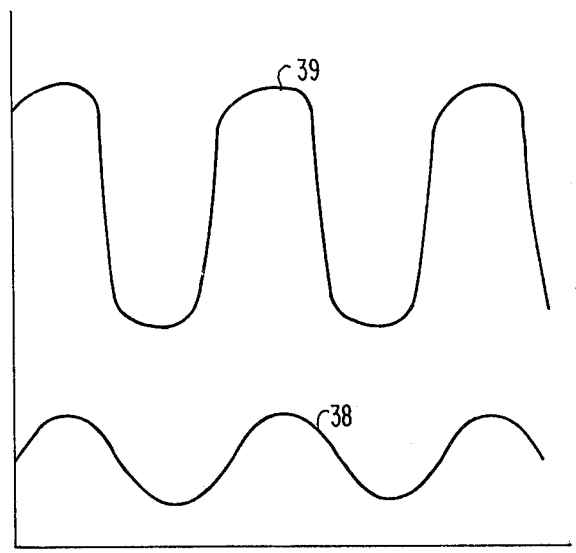
FIGS. 4A and 4B are graphical representations of output waveforms of the clock driver shown in FIG. 2 illustrating the range and phase shifts obtained with the adjustable phase delay circuit.
Figure 4B:
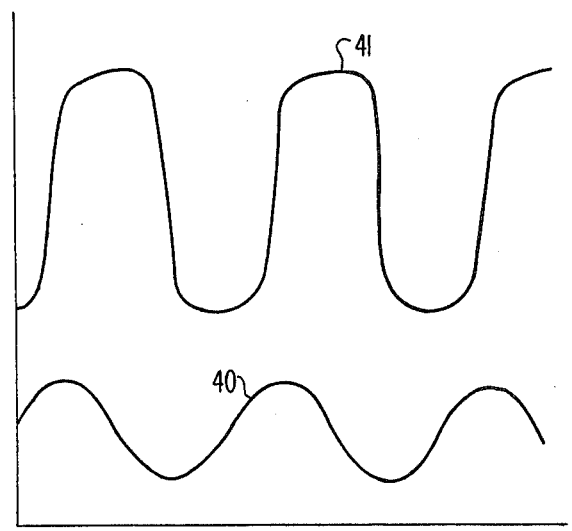

The performance of the clock pulse driver shown in FIG. 2 is demonstrated by the graphical representations of input and output signals shown in FIGS. 3 and 4. Specifically, FIG. 3A shows a low amplitude input sinewave signal 33 to the receiver amplifier 10 and the resultant squarewave clock signal 34 at the output of limiter amplifier 30. FIG. 3B shows a high amplitude input sinewave clock signal 36 and the corresponding output squarewave clock signal 37. It will be observed that the output clock signal exhibits a constant amplitude for a wide range of input amplitude sinewave clock signals. This is due to the action of the limiter amplifiers 26 and 30. FIGS. 4A and 4B illustrate the phase shift delay which may be obtained by means of the RC phase shift circuit of the clock driver. In FIG. 4A, the input sinewave signal 38 results in an output rectangular wave clock signal 39 for one value of capacitance in the phase shift network, and in FIG. 4B, the input sinewave clock signal 40, which is the same in amplitude and phase as signal 38, results in the rectangular output clock signal 41 for another value of capacitance in the phase shift network. It will be observed that a considerable phase shift delay is evident between the output clock pulse signals 39 and 41, and this delay is continuously variable over a wide range.

It will be apparent that the embodiment shown is only exemplary and that various modifications can be made in construction and arrangement within the scope of the invention as defined in the appended claims.

What is claimed is:

1. A sinewave clock distribution network permitting simplified distribution and synchronization in very high speed logic and digital transmission systems of the type which include a plurality of digital circuits which are synchronized with clock pulse input signals, said network comprising:
   a. a central sinewave clock generator for producing small amplitude clock signals,
   b. a plurality of clock drivers each of which is located in the vicinity of said digital circuits to which clock pulse input signals are to be supplied, and
   c. a low impedance transmission line branching network connecting the output of said clock generator to the inputs of said clock drivers, each of said clock drivers comprising:
      i. a receiver amplifier having its input connected to said transmission line branching network,
      ii. phase shift means connected to the output of said receiver amplifier for providing an adjustable phase delay in the output sinewave signal from said receiver amplifier, and
      iii. a limiter amplifier connected to receive the phase delayed outut from said phase shift means, said limiter amplifier providing a squarewave clock signal output to a respective one of said digital circuits.

2. A sinewave clock distribution network as recited in claim 1 wherein said phase shift means is an RC phase shift network comprising a resistor and a variable capacitance.

3. A sinewave clock distribution system as recited in claim 2 wherein said receiver amplifier has a balanced output and said resistor and variable capacitance are connected in parallel to said balanced output.

4. A sinewave clock distribution system as recited in claim 3 wherein said variable capacitance comprises a variable capacitance diode and an adjustable voltage source connected to said variable capacitance diode for adjusting the capacitance thereof.

5. A sinewave clock distribution system as recited in claim 3 wherein said variable capacitance comprises two variable capacitance diodes connected back-to-back and an adjustable voltage source connected to the common junction between said variable capacitance diodes for adjusting the combined capacitance thereof.

6. A sinewave clock distribution system as recited in claim 5 wherein said adjustable voltage source includes temperature compensation means for maintaining the voltage to said variable capacitance diodes constant as a function of temperature.

7. A sinewave clock distribution system as recited in claim 1 further comprising threshold means connected to said receiver amplifier for detecting the sinewave clock signal in a standing wave on said transmission line branching network.

8. A sinewave clock distribution system as recited in claim 7 wherein said threshold means is also connected to said limiter amplifier for establishing the value of the limited, phase delayed clock signal.

* * * * *